(12) United States Patent
Mostafazadeh et al.

(10) Patent No.: US 7,838,991 B1
(45) Date of Patent: Nov. 23, 2010

(54) METALLURGY FOR COPPER PLATED WAFERS

(75) Inventors: Shahram Mostafazadeh, San Jose, CA (US); Viraj Patwardhan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 473 days.

(21) Appl. No.: 11/671,422

(22) Filed: Feb. 5, 2007

(51) Int. Cl.
    *H01L 23/48* (2006.01)
(52) U.S. Cl. .................................. 257/737; 257/E23.02
(58) Field of Classification Search ................. 257/700, 257/737, 781, 751, 753, E23.02; 361/779
See application file for complete search history.

(56) References Cited

U.S. PATENT DOCUMENTS

| | | | |
|---|---|---|---|
| 6,327,158 B1 | 12/2001 | Kelkar et al. | |
| 6,462,426 B1 * | 10/2002 | Kelkar et al. | ................. 257/781 |
| 7,282,375 B1 * | 10/2007 | Kelkar | .......................... 438/15 |
| 7,385,297 B1 | 6/2008 | Gumaste et al. | |
| 7,420,280 B1 | 9/2008 | Kelkar | |
| 2004/0188378 A1 * | 9/2004 | Wu et al. | ....................... 216/13 |
| 2004/0245630 A1 * | 12/2004 | Huang et al. | ................. 257/737 |
| 2006/0091536 A1 * | 5/2006 | Huang et al. | ................. 257/734 |
| 2006/0103020 A1 * | 5/2006 | Tong et al. | ................... 257/738 |
| 2006/0180945 A1 * | 8/2006 | Seshan et al. | ................ 257/781 |
| 2007/0120264 A1 * | 5/2007 | Lehr et al. | .................... 257/771 |

OTHER PUBLICATIONS

Young's Modulus; May 23, 2009; Wikipedia; http://en.wikipedia.org/wiki/Young's_modulus; pp. 1-6; retrieved Jun. 4, 2009.*

* cited by examiner

*Primary Examiner*—Matthew C Landau
*Assistant Examiner*—Jessica Hall
(74) *Attorney, Agent, or Firm*—Beyer Law Group LLP (57) ABSTRACT

Improved protective metallization is described for bumped copper-top semiconductor chips. The semiconductor device includes a top wafer fabrication passivation layer with openings through which contact pads are exposed. A patterned copper layer is formed over the passivation layer and is electrically coupled to the contact pads through the openings. A metallic barrier layer is provided between the contact pads and the patterned copper layer. A titanium metallization layer overlies the patterned copper layer and cooperates with the barrier layer to envelop the copper layer in the regions of the contact pads. An aluminum metallization layer overlies the titanium metallization layer. An electrically insulating protective layer overlies the aluminum metallization and passivation layers. The protective layer includes openings in which underbump metallization stacks are formed. Each underbump metallization stack electrically connects to the aluminum metallization layer through an opening in the protective layer. Solder bumps adhere to the underbump metallization stacks.

11 Claims, 6 Drawing Sheets

METALLURGY FOR COPPER PLATED WAFERS

BACKGROUND OF THE INVENTION

The present invention relates generally to the packaging of integrated circuits. More particularly, improved protective metallurgy is described that works particularly well with copper topped wafers used in bumped chip scale packages.

There are a number of conventional processes for packaging integrated circuits. One approach that is commonly referred to as "flip chip" packaging generally contemplates forming solder bumps (or other suitable contacts) directly on the face of an integrated circuit die. In some situations, the contacts are formed directly on I/O pads formed on the die, whereas in other situations the contacts are redistributed. The die is then typically attached to a substrate such as a printed circuit board or package substrate such that the die contacts directly connect to corresponding contacts on the substrate.

A recent development in integrated circuit design has been to include a relatively thick copper layer on top of the dice at the wafer level. The copper layer can be used for routing and a variety of other purposes. Typically, the copper layer is applied after the wafer fabrication and away from (or at least outside of) the wafer fabrication site. Therefore, the copper layer cannot readily be covered with traditional wafer fabrication dielectric materials such as silicon dioxide or silicon nitride unless the wafer is returned to the fab for further processing, which is an expensive proposition. Therefore, a challenge that has been encountered in using copper topped integrated circuits in bumped and/or flip chip designs relates to how to protect the copper layer without incurring undo costs.

SUMMARY OF THE INVENTION

In one aspect of the present invention, an improved protective metallization arrangement is described that is particularly useful in bumped copper-top type semiconductor chips. In one aspect of the invention, the semiconductor device has a plurality of I/O pads that are exposed through openings in a top wafer fabrication passivation layer. A patterned copper layer is formed over the top wafer fabrication passivation layer. The patterned copper layer is electrically coupled to the I/O pads through the passivation openings. A metallic barrier layer is provided between the I/O pads and the patterned copper layer. A titanium metallization layer overlies at least portions of the patterned copper layer and preferably cooperates with the barrier layer to envelop the copper layer in the regions of the I/O pads. A first aluminum metallization layer overlies at least portions of the titanium metallization layer. An electrically insulating protective layer overlies the first aluminum metallization layer and the top wafer fabrication passivation layer. The protective layer is preferably formed from an organic material and includes a plurality of contact openings. Underbump metallization stacks are formed in the contact openings. Each underbump metallization stack is electrically connected to the first aluminum metallization layer through its associated contact opening in the protective layer. Solder bumps are preferably then adhered to the underbump metallization stacks.

In some embodiments, the underbump metallization stacks each include a second aluminum layer in contact with the first aluminum layer, a nickel vanadium layer that overlies the second aluminum layer, and a second copper layer that overlies the nickel vanadium layer. Peripheral portions of each of the layers in the underbump metallization stack are preferably arranged to extend over at least some of the adjacent protective layer.

In dice that include trim pads, each trim pad may be covered by a segment of the patterned copper together with its overlying titanium and aluminum layers and its underlying barrier layer, which together effectively form a trim pad stack. In such embodiments, the protective layer is arranged to fully cover and electrically insulate the trim pad stacks.

BRIEF DESCRIPTION OF THE DRAWINGS

The invention, together with further objects and advantages thereof, may best be understood by reference to the following description taken in conjunction with the accompanying drawings in which.

In the drawings, like reference numerals designate like structural elements. It should also be understood that the depictions in the figures are diagrammatic and not to scale.

DETAILED DESCRIPTION OF THE PREFERRED EMBODIMENTS

The present invention relates generally to the packaging of integrated circuit dice. As explained in the background section, a recent development in integrated circuit design and packaging has been the inclusion of a relatively thick copper layer on top of the dice at the wafer level. The copper layer can be used for routing and a variety of other purposes. In practice, the copper layer is often applied after the wafer fabrication and away from (or at least outside of) the wafer fabrication site. Therefore, the copper layer frequently cannot readily be covered with traditional wafer fabrication passivation materials such as silicon dioxide or silicon nitride. Instead, the copper layer may be covered with an organic protective coating, such as benzocyclobutene (BCB) or polyimide. Contact openings are typically formed in the protective coating to facilitate electrically connecting the integrated circuits to external devices. In wirebonded packages, the contact openings are eventually encapsulated (and thereby protected) by a molding compound. However in flip chip and other bumped wafer level chip scale packages, the molding material is typically not available. The present invention provides protective metallurgy designed to protect the copper layer from corrosion while at the same time providing a good foundation for the solder bumps.

Figure 1:
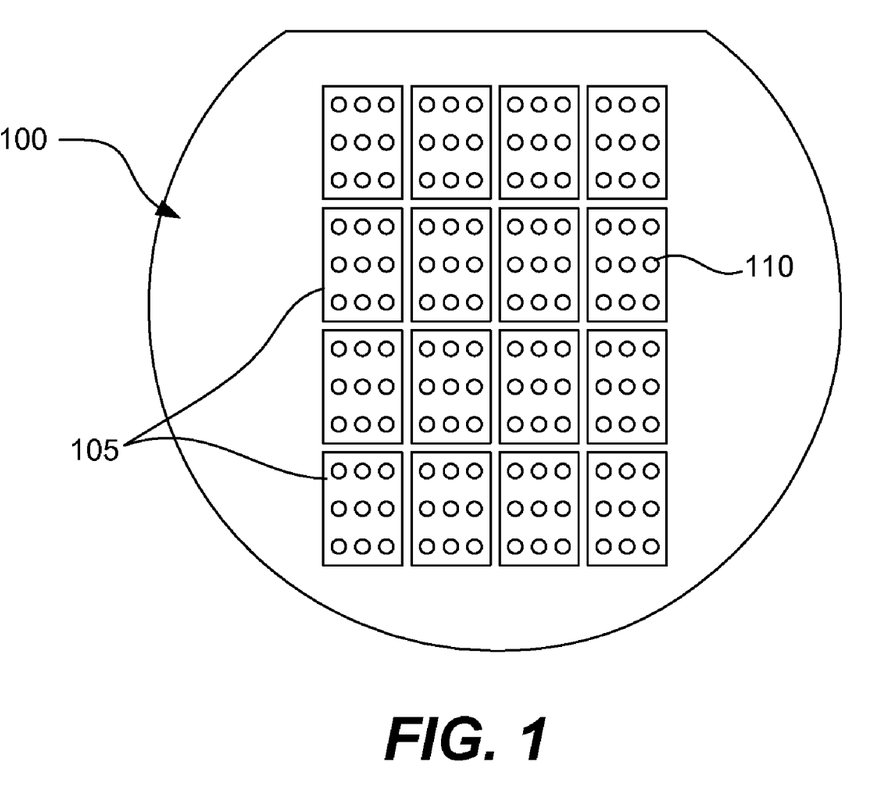
FIG. 1 is a diagrammatic top view of a semiconductor wafer formed in accordance with the present invention.

Referring initially to FIG. 1, a representative wafer 100 that incorporates the present invention will be described. The wafer 100 includes a multiplicity of dice 105. In the diagrammatic illustration, only a few dice are shown. However, as will be appreciated by those familiar with the art, state of the art wafers tend to have on the order of hundreds, to thousands or tens of thousands of dice formed therein and it is expected that even higher device densities will be attained in future wafers. Generally, each die 105 on the wafer 100 will have a number of I/O pads (often referred to as bond pads) formed thereon. In existing flip chip devices, underbump metallization stacks may be formed on the bond pads to support solder bumps that are mounted directly over the bond pads. (In other devices, the solder bumps may be redistributed relative to the bond pads). In the present invention, a patterned copper layer (e.g. a routing layer) is provided over the top wafer fabrication passivation layer. Protective metallurgy is provided above (and typically below) the copper layer to help insure a good electrical contact between the bond pads and the routing layer, protect the copper layer from corrosion and provide a good foundation for solder bumps formed over the bond pads.

Figure 2A:
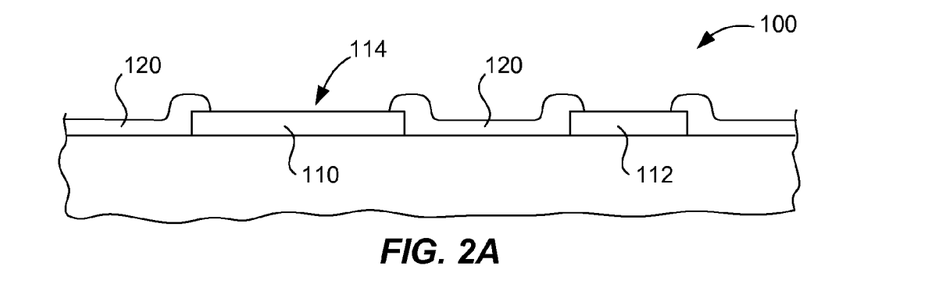
FIGS. 2(a)-2(h) are a series of cross sectional views of a small segment of a wafer that diagrammatically illustrate the formation of copper top and underbump metallization layers on a wafer in accordance with one embodiment of the present invention.

Referring next to FIG. 2(a) the formation of the protective metallurgy in accordance with one embodiment of the invention will be described. Initially, a wafer 100 may be formed in any suitable manner. Typically, a fabricated wafer 100 will have a plurality of bond pads (I/O pads) 110. In some applications (most commonly in analog devices) there may also be a plurality of trim pads 112 or other interconnect structures that are exposed on the top surface of the wafer. The bond pads (and trim pads) are typically formed from aluminum, although that is not a requirement. The uppermost layer on the wafer is typically formed from a traditional, inorganic, wafer fabrication passivation material such as silicon dioxide or silicon nitride. Openings 114 may be formed in the passivation layer 120 over the bond pads using conventional wafer fabrication masking and etching processes. Preferably, the passivation layer 120 overlies peripheral portions of the bond pads 110 and trim pads 112. As will be appreciated by those familiar with the art, the described arrangement is a conventional wafer.

Figure 2B:
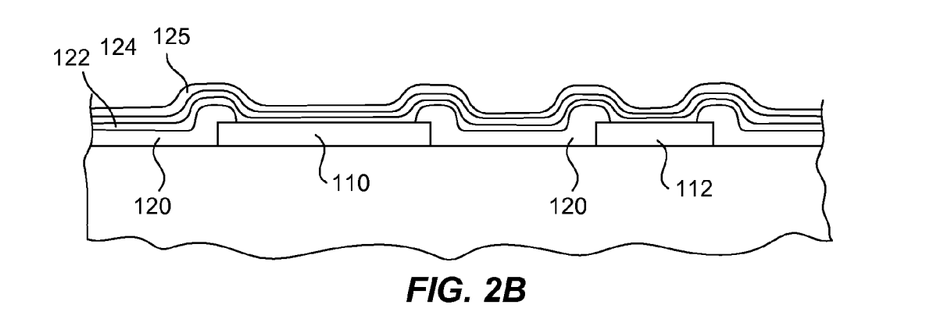
Figure 2C:
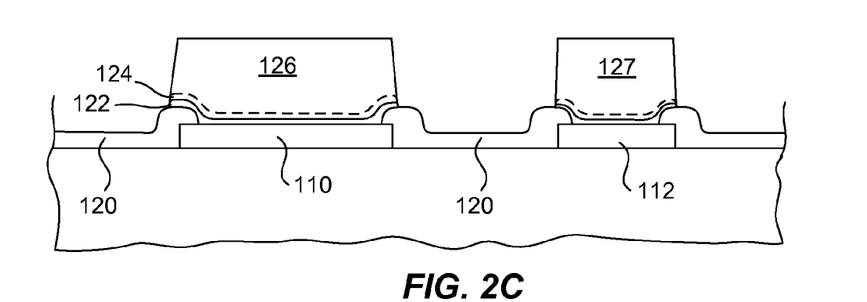

Referring next to FIGS. 2(b)-2(h) in conjunction with the flow chart of FIG. 3, one suitable approach for forming the desired protective metallization will be described. Referring initially to FIG. 2(b), a first titanium layer 122, a copper seed layer 124 and a sacrificial titanium layer 125 are sequentially deposited over the bond pads over the face of the wafer using conventional deposition processes (steps 303, 306 an 309). The thicknesses of the titanium layers 122, 125 and the copper seed layer 122 may vary widely, although they are preferably relatively thin layers and may be formed by traditional sputtering techniques. Generally, such deposition is accomplished by sputtering thin layers of metal over the entire surface of the wafer and then etching away the undesired portions of the metal layers. By way of example, thicknesses on the order 100-1000 angstroms, as for example, about 300 Å (angstroms) work well for the titanium layers. Thickness on the order of 1000 to 10,000 angstroms, as for example of 3000 Å have been found to work well for the copper seed layer.

The initial titanium layer 122 serves several purposes. Generally, titanium adheres well to both the aluminum pads 110, 112, and to wafer fabrication passivation materials such as silicon dioxide or silicon nitride. Additionally, the titanium layer 122 acts as a barrier layer between the aluminum pads 110, 112 and the overlying copper. The copper seed layer 124 acts as a seed layer for the subsequent deposition (e.g. buildup) of a copper routing layer. The sacrificial titanium layer 125 is an optional layer that is applied primarily because titanium serves as a good foundation for the resist (mask) used to pattern the routing metal layers.

After all three metal layers 122, 124 and 125 have been deposited, a resist (not shown) is applied over the sacrificial titanium layer 125 and is patterned to expose the desired footprint for the copper routing layer (step 312). At this point, the sacrificial titanium layer is exposed in the regions that are intended to serve as part of the copper routing layer and the resist still covers the remainder of the wafer surface. The exposed sacrificial titanium layer is then etched away to expose the copper seed layer 124 (step 315). Thus, the copper seed layer 124 is only exposed in the regions intended to serve as the copper routing layer. After the desired sections of the copper seed layer 124 have been exposed, a relatively thick copper routing (interconnect) layer 126 is built up from the seed layer. The copper routing layer may include features such as interconnects between bond pads, interconnects to passive devices formed on the surface of the wafer, pad redistribution lines, simple pads formed over the bond pads 110/ trim pads 112 and/or other structures. Reference number 127 illustrates a portion of the routing layer 126 that takes the form of a simple copper pad formed over the trim pad 112. The thickness of the routing layer may vary widely, but in current devices, thickness on the order of 5 to 40 microns are common, although it is contemplated that both thicker and thinner routing layers may be used and/or become more popular in the future.

The routing layer 126 may be built by any suitable process. By way of example, conventional electroplating works well. It should be appreciated that the copper seed layer and the routing layer effectively form a single copper layer after they have been deposited. Accordingly, it is possible to form the copper layer in a single step. However, using today's technology it is currently more cost effective to apply the copper layer in the described two-step process (i.e. sputtering a seed layer and electroplating over the seed layer). This is because sputtering is not well suited for forming thick layers and copper electroplating works much better when there is a copper seed layer. In FIG. 2(c), the boundary between the copper seed layer and the overlying electroplating is shown in dashed lines to emphasize the distinction, but thereafter, it is illustrated as the single integral copper layer 126 that it becomes.

In the described embodiment, electroplating is used to build the copper layer from the seed layer (step 318). As will be appreciated by those familiar with the art, electroplated copper will only build over the exposed copper seed layer and it will not accumulate significantly over the resist.

After the copper routing layer 126 has been built to its desired thickness, the resist and excess portions of the titanium barrier layer 122, the copper seed layer 124 and the sacrificial titanium layer 125 are removed using conventional techniques (e.g. masking and etching). Generally, the routing layer is masked during the etching of the lower metallization so that the integrated routing layer and the underlying portions of the titanium barrier layer are not affected by the etch removal of the excess portions of these layers. After the excess portions of the lower metallization have been removed, the structure illustrated in FIG. 2(c) remains. That is, in the regions of the bond pads 110 and trim pads 112, a titanium barrier layer 122 separates the overlying portions of the copper routing layer 126 from the aluminum pads. In other regions where the routing layer extends over the passivation layer 120, the titanium layer 122 is positioned between the passivation layer 120 and the copper routing area.

Preferably, the footprint of the retained portions of the first titanium barrier layer 122 and the copper routing layer that is located directly above the bond pads 110 is at least slightly larger than the corresponding footprint of the openings 114 in passivation layer 120 so that none of the aluminum bond pads 110 are exposed.

Figure 2D:
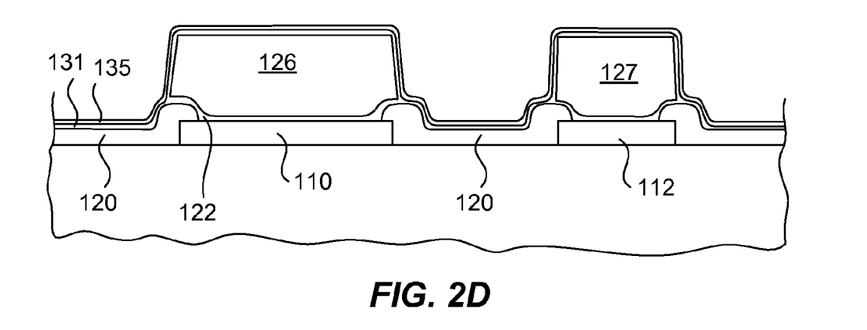
Figure 3:
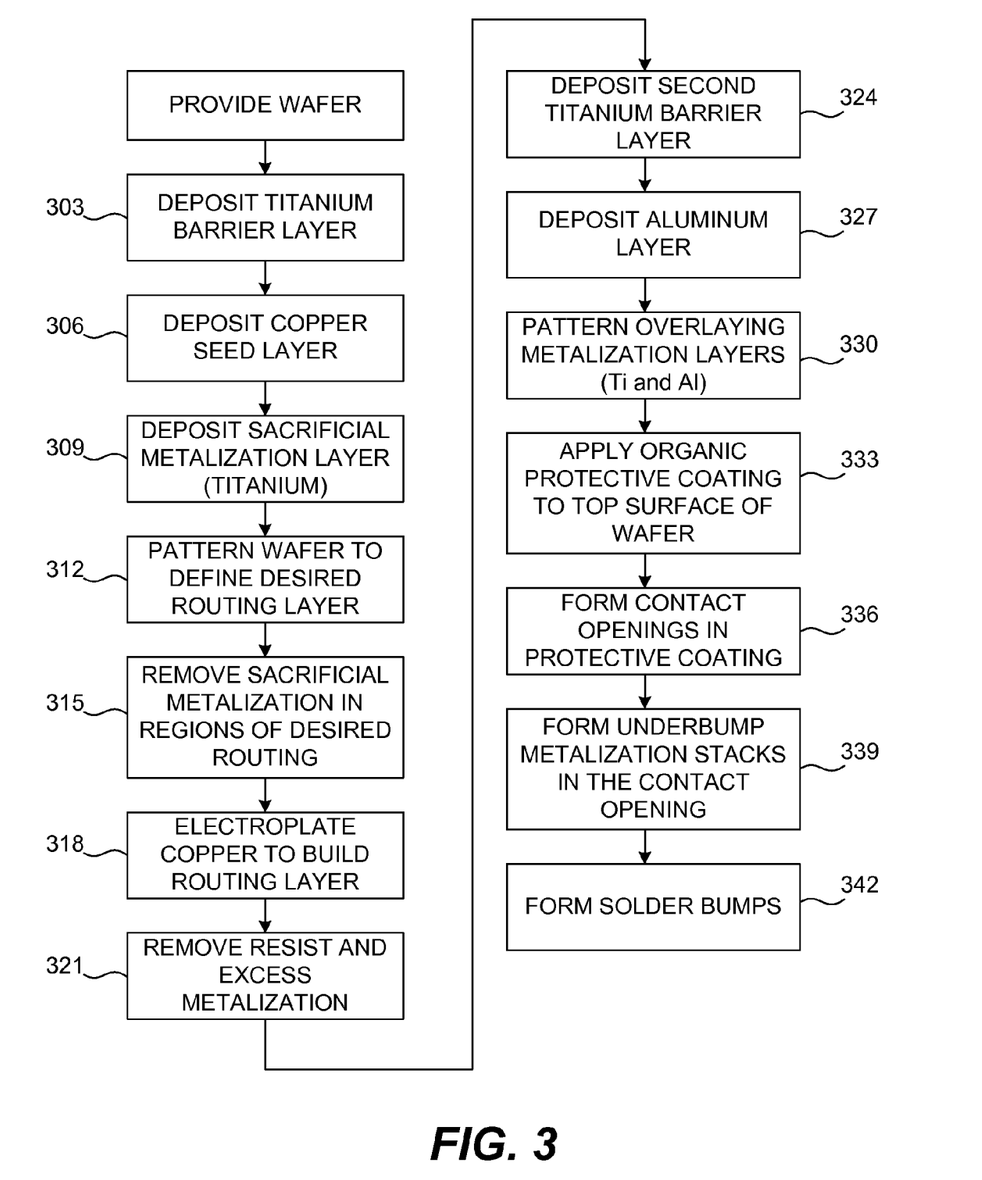
FIG. 3 is a flow chart illustrating steps in one method of forming a device in accordance with the present invention.

After the copper routing layer has been formed appropriately, a second titanium layer 131 is deposited over the routing layer as best seen in FIG. 2(d). Step 324. Thereafter a first aluminum layer 135 is deposited over the second titanium layer 131 (step 327). The thicknesses of the over layers can also be widely varied. Generally, these layers are relatively thin (e.g., on the order of 100-1000 angstroms), and although those dimensions are preferred, they are not a requirement. The second titanium layer 131 and the first aluminum layer 135 may be formed using any suitable deposition process. By way of example, a conventional sputter/etch-back process works well. In such an approach, both the second titanium layer and the first aluminum layer would typically be sputtered over the entire surface of the wafer and then masked and etched (step 330).

Figure 2E:
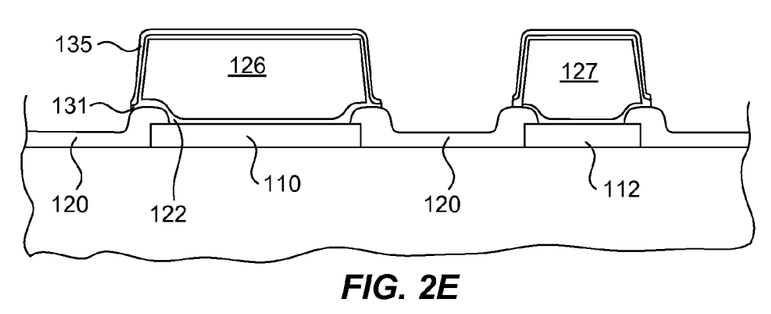

In the illustrated embodiment, the footprint of the first titanium layer 122 underlying the various pads 110/112 are at least slightly larger than their corresponding pads. Therefore, when the second titanium layer 131 is deposited over the routing layer, it will effectively envelop the copper pads as seen in FIG. 2(e).

Figure 2F:
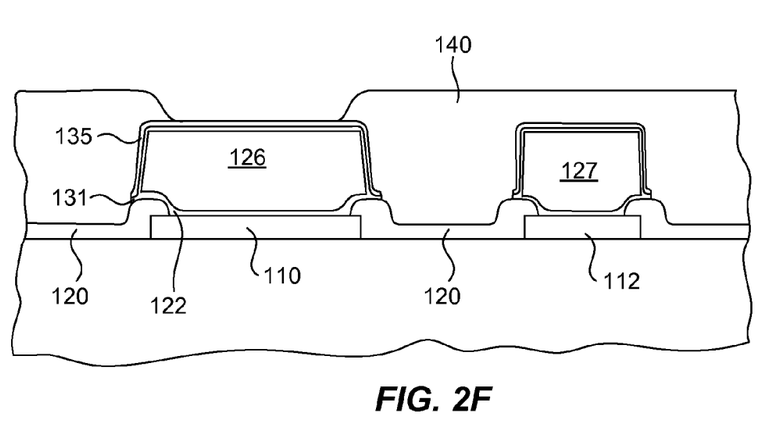

After the metallization layers 131, 135 have been applied and patterned, an insulating protective coating 140 is applied over the top surface of the wafer. FIG. 2(f) step 333. A variety of different materials may be used as the protective coating. However, it is contemplated that the protective coating is not formed from a traditional wafer fabrication dielectric material such as silicon dioxide or silicon nitride. Rather it is preferably formed from an organic material such as benzocyclobutene (BCB) or polyimide.

After the protective coating has been applied, contact openings 142 are formed in the protective layer 140 over the copper pads to facilitate electrical connection of the solder bumps to the bond pads. Step 336. The openings 142 are preferably sized so that they do not extend beyond the bounds of the copper pads. Therefore, the protective layer 140 extends over peripheral portions of the copper pads as can readily be seen in FIG. 2(f). It should be noted that the similar openings are generally not formed over the trim pads 112 or other features of the routing layer 126 so the protective layer 140 electrically insulates these features from external devices.

Therefore, in devices that incorporate trim pads 112, the wafer would preferably be tested and trimmed after the routing layer had been applied, but before the protective layer is applied. Generally, the testing and trimming would be done after application of the first aluminum layer (although this is not a requirement and the timing of the testing may vary).

Figure 2G:
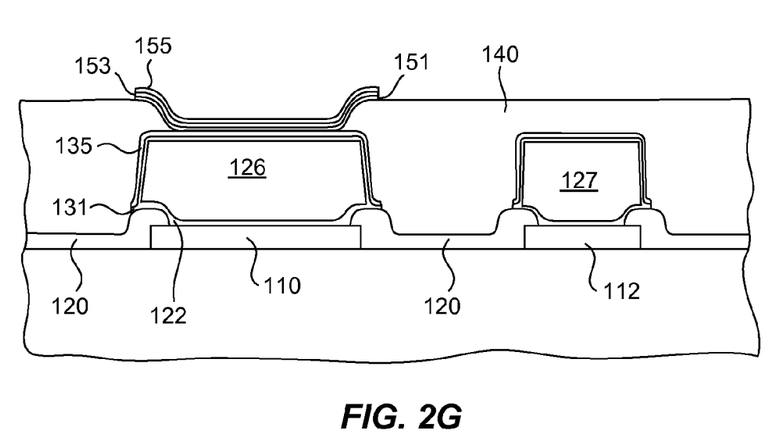
Figure 2H:
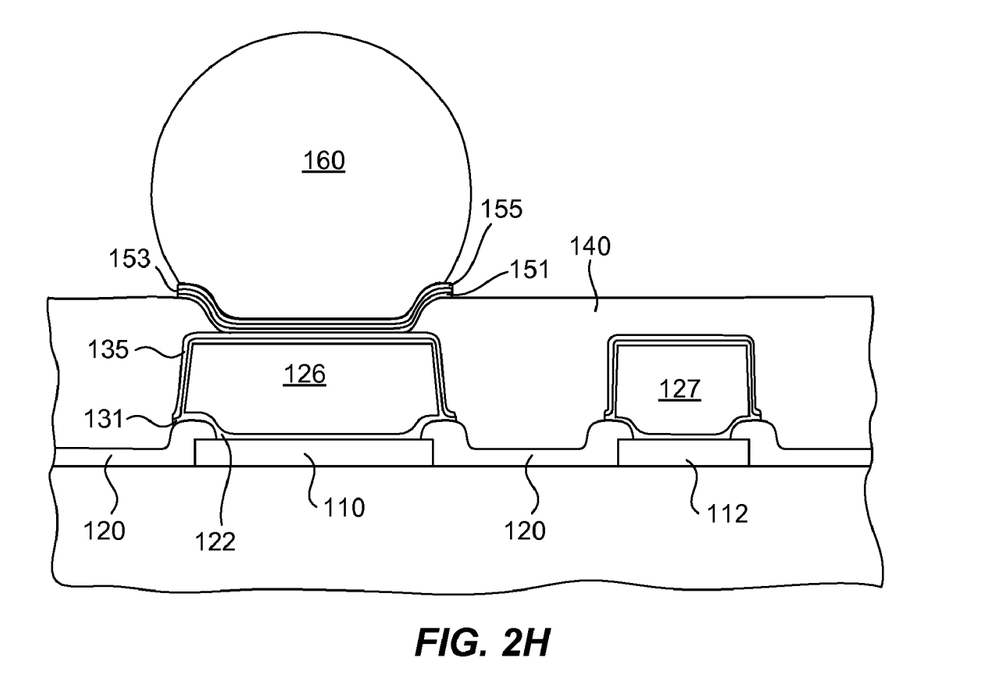

After the contact openings have been formed, an underbump metallization stack 144 is formed in each opening to serve as a base for an associated solder bump as best seen in FIG. 2(g)—step 339. The composition of the underbump metallization stack may vary somewhat. In the illustrated embodiment, a three-layer stack is provided. The lowermost layer of the underbump metallization stack is a second aluminum layer 151, which bonds well to the first aluminum layer 135. The second layer in the stack is a nickel vanadium layer 153 and the uppermost layer 155 is copper. The nickel vanadium layer 153 serves as a barrier layer between the aluminum and copper layers. The copper layer 155 serves as the attachment point for the solder bump 160. Such underbump metallization stacks have been used in other applications as well.

The solder bumps 160 may be attached by any of a variety of known solder bumping processes. Step 342. After the solder bumps have been attached, the wafer may be diced to provide singulated integrated circuit devices having the described protective metallization.

In an alternative embodiment that incorporates trim pads, a non-solder wettable conductive layer (such as a titanium layer) could be applied over at least the trim pad stacks and exposed through the protective layer to permit probing, testing and trimming the wafer after the protective layer has been applied. Such arrangements are described in commonly assigned U.S. Pat. No. 6,327,158, which is incorporated herein by reference.

Figure 4:
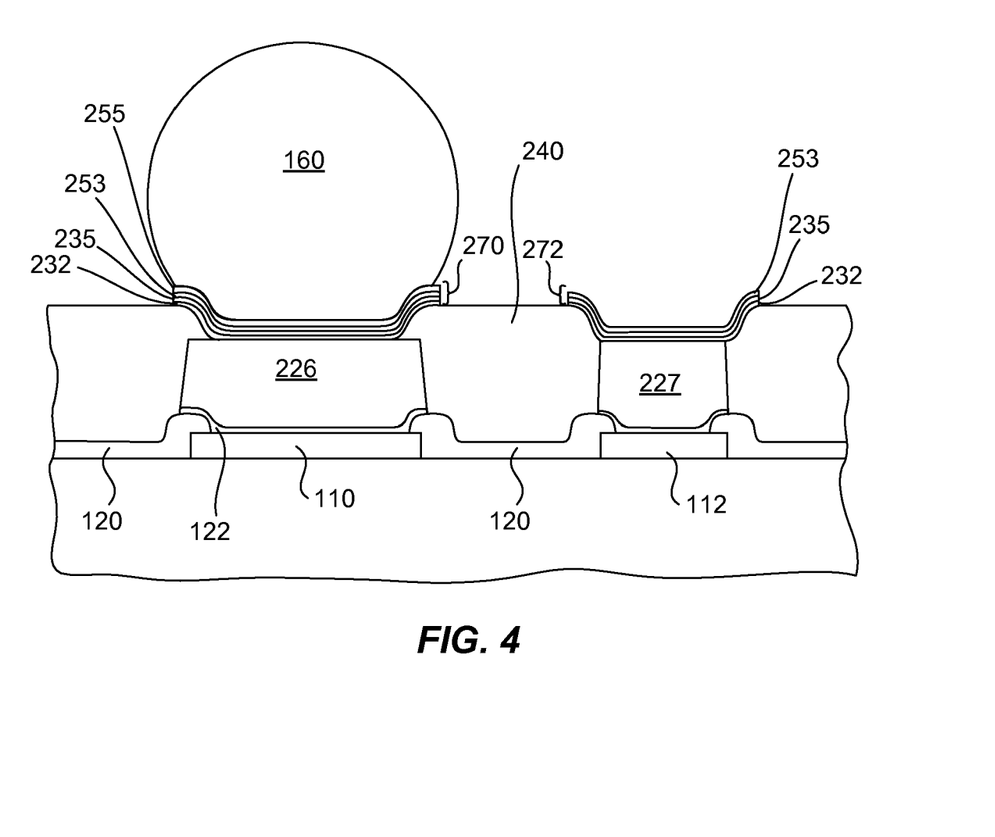
FIG. 4 is a cross sectional view of a small segment of a wafer that illustrates metallurgy used in another embodiment of the invention.

Another alternative embodiment will be described with reference to FIG. 4. In this embodiment, the first titanium barrier layer 122 and the copper routing layer 126 may be formed in the same manner as described above with respect to the first embodiment. In this embodiment, the second persistent titanium layer 131 and the first aluminum layer 135 are not deposited over the copper routing layer 126 before the organic protective coating 140 is applied as described above with respect to the first embodiment. Rather, the an organic protective coating 240 is applied over the copper routing layer 126 and contact openings 242 are formed in the protective coating over regions intended to define copper contact pads 226 and copper trim pads 227.

In this embodiment, underbump and trim pad metallization stacks 270, 272 are formed directly over the copper contact pads 226 and 227. In the illustrated embodiment, the first layer of the metallization stacks is a titanium layer 232, the second layer is an aluminum layer 235, and the third is a nickel vanadium (NiV) layer 253. As will be appreciated by those familiar with the art, nickel vanadium is not very solder wettable and is therefore used as the topmost layer for the trim pad metallization stacks 272. A final copper layer 255 is then formed over the nickel vanadium layer 253 as the topmost layer in the underbump metallization stacks 270. Appropriate masking can be used to protect the trim pad metallization stacks 272 from the copper layer. After the underbump metallization stacks 270 have been formed, the solder bumps may be formed over the underbump metallization stacks as previously described. This embodiment shares the advantages of exposing the trim pads so that the dice can be trimmed at the wafer level after solder bumping, which is advantageous in certain circumstances from both cost and performance perspectives.

The described arrangement has a number of benefits in addition to protecting the copper routing layer from the environment. By way of example, the underbump metallization stacks provide a solderable surface that facilitates ease of wafer bumping. The described metallization also provides barrier structures that protect against the phenomena of copper "spalling". Additionally, the described process requires a relatively minimal number of masking step to form the protective metallization structures. The described arrangement utilizes relatively few masking steps. Of course, in other embodiments, the various sputtered layers could be masked and etched on an individual basis, or in other reasonable combinations.

Although only a few embodiments of the invention have been described in detail, it should be appreciated that the invention may be implemented in many other forms without departing from the spirit or scope of the invention. The foregoing description has focused primarily on the formation of the protective metallization formed between the bond pads and overlying solder bumps. However, it should be appreciated that a variety of additional or different steps and/or processes may be employed to take advantage of features of the copper routing layer. For example, it may be desirable to form certain passive devices on the top surface of the wafer and use the routing layer to interconnect those devices. Further, if trim pads are provided, then appropriate wafer testing and trimming operations would be carried out before the protective layer is applied.

Of course, a variety of other steps could be performed at the wafer level as well. For example, it may be desirable to apply a protective backcoating to the back surface of the wafer, to mark the dice on the wafer, to test the wafer, to provide an underfill coating or solder bump support layer on the front surface of the wafer and/or a variety of other processes. It also may be desirable to mark the dice and/or provide additional wafer or die testing steps.

Although specific metallurgy has been described, it should be appreciated that in various embodiments certain additional layers may be added, and other layers may be changed or eliminated. Therefore, the present embodiments should be considered as illustrative and not restrictive and the invention is not to be limited to the details given herein, but may be modified within the scope and equivalents of the appended claims.

What is claimed is:

1. An integrated circuit wafer comprising a multiplicity of dice, the dice each including a multiplicity of integrated circuits and a plurality of contact pads that are exposed through contact pad openings formed in a top wafer fabrication passivation layer that constitutes an uppermost inorganic passivation layer formed on the wafer, the wafer further including:
    a patterned copper layer that extends over the top surface of the top wafer fabrication passivation layer, wherein the patterned copper layer is electrically coupled to at least some of the contact pads through the contact pad openings;
    a first titanium metallization layer that overlies at least portions of the patterned copper layer;
    a first aluminum metallization layer that overlies at least portions of the first titanium metallization layer;
    an electrically insulating organic protective layer that overlies the first aluminum metallization layer and the top wafer fabrication passivation layer, there being a plurality of contact openings in the protective layer; and
    a plurality of underbump metallization stacks, each underbump metallization stack being electrically connected to the first aluminum metallization layer through an associated contact opening in the protective layer, wherein peripheral portions of the underbump metallization stacks extend over at least some adjacent portions of the protective layer.

2. An integrated circuit wafer as recited in claim 1 further comprising a plurality of solder bumps, each solder bump being adhered to an associated underbump metallization stack.

3. A wafer as recited in claim 1 wherein the underbump metallization stacks each include:
    a second aluminum layer in contact with the first aluminum layer;
    a nickel vanadium layer that overlies the second aluminum layer; and
    a second copper layer that overlies the nickel vanadium layer; and
    wherein peripheral portions of each of the layers in the underbump metallization stack extend over at least some of the adjacent protective layer.

4. A wafer as recited in claim 1 wherein each die further comprises at least one trim pad that is exposed through a trim pad opening formed in the top wafer fabrication passivation layer, and wherein the portions of the patterned copper layer, the first titanium metallization layer and the first aluminum metallization layer that overlie the trim pad form a trim pad stack and the protective layer fully covers the trim pad stack.

5. A wafer as recited in claim 1 further comprising a second titanium metallization layer positioned between the contact pads and the patterned copper layer that acts as an electrically conductive barrier layer between the contact pads and the patterned copper layer, wherein the second titanium metallization layer connects with the first titanium metallization layer to envelop interconnects in the patterned copper layer.

6. The integrated circuit wafer of claim 1 wherein the thickness of the patterned copper layer above the contact pads at least equals the depth of the contact pad openings.

7. The integrated circuit wafer of claim 1 wherein the thickness of the patterned copper layer above the contact pads is at least 50,000 Angstroms.

8. The integrated circuit wafer of claim 1 wherein at least one of the contact openings in the protective layer is positioned laterally offset to the associated contact pad opening in the top wafer fabrication passivation layer.

9. An integrated circuit wafer comprising a multiplicity of dice, the dice each including a multiplicity of integrated circuits and a plurality of contact pads that are exposed through contact pad openings formed in a top wafer fabrication passivation layer, the wafer further including:
    a patterned copper layer formed over the top wafer fabrication passivation layer, wherein the patterned copper layer is electrically coupled to at least some of the contact pads through the contact pad openings;
    a titanium metallization layer positioned between the contact pads and the patterned copper layer that acts as an electrically conductive barrier layer between the contact pads and the patterned copper layer;
    an electrically insulating protective layer that overlies the patterned copper layer and the top wafer fabrication passivation layer, there being a plurality of contact openings in the protective layer; and
    a plurality of underbump metallization stacks, each underbump metallization stack being electrically connected to the patterned copper layer through an associated contact opening in the protective layer, wherein peripheral portions of the underbump metallization stacks extend over at least some adjacent portions of the protective layer; and
    wherein each die further comprises at least one trim pad that is exposed through a trim pad opening formed in the top wafer fabrication passivation layer, and wherein (i) a segment of the patterned copper layer is electrically coupled to each trim pad, (ii) trim openings are also formed in the protective layer, (iii) a trim pad metallization stack is formed in each trim opening,
    the uppermost exposed layer of the trim pad metallization stacks are formed from a non-solder wettable material;
    the uppermost exposed layer of the underbump metallization stacks are formed from a solder wettable material; and
    the underbump metallization stacks have at least one more layer than the trim pad metallization stacks.

10. The integrated circuit wafer of claim 9 wherein the underbump metallization stack and the trim pad metallization stack include an identical ordered set of metal layers excepting the uppermost exposed layer of the underbump metallization stack.

11. The integrated circuit wafer of claim 9 wherein the underbump metallization stacks and the trim pad metallization stacks each include:
    a titanium layer in contact with the patterned copper layer;
    an aluminum layer in contact with the titanium layer;
    a nickel vanadium layer that overlies the aluminum layer; and
    the underbump metallization stacks each include a second copper layer that overlies the nickel vanadium layer.

* * * * *